(12) United States Patent
Mitchell et al.

(10) Patent No.: US 11,125,772 B2
(45) Date of Patent: *Sep. 21, 2021

(54) SYSTEM WITH OVEN CONTROL AND COMPENSATION FOR DETECTING MOTION AND/OR ORIENTATION

(71) Applicant: Bliley Technologies, Inc., Erie, PA (US)

(72) Inventors: Jay Mitchell, Ypsilanti, MI (US); Anthony Challoner, Manhattan Beach, CA (US); Sangwoo Lee, Ann Arbor, MI (US)

(73) Assignee: BLILEY TECHNOLOGIES, INC., Erie, PA (US)

( * ) Notice: Subject to any disclaimer, the term of this patent is extended or adjusted under 35 U.S.C. 154(b) by 170 days.

This patent is subject to a terminal disclaimer.

(21) Appl. No.: 16/459,775

(22) Filed: Jul. 2, 2019

(65) Prior Publication Data

US 2020/0025795 A1    Jan. 23, 2020

Related U.S. Application Data

(63) Continuation of application No. 14/925,349, filed on Oct. 28, 2015, now Pat. No. 10,386,385.

(51) Int. Cl.
*G01P 21/00* (2006.01)
*G01K 13/00* (2021.01)
(Continued)

(52) U.S. Cl.
CPC ............ *G01P 21/00* (2013.01); *B81B 7/0096* (2013.01); *G01C 25/005* (2013.01); *G01K 13/00* (2013.01);
(Continued)

(58) Field of Classification Search
CPC ............ G01P 21/00; G01P 2015/0871; G01C 25/005; B81B 7/0096; B81B 2201/0235; B81B 2201/0242; G01K 13/00
See application file for complete search history.

(56) References Cited

U.S. PATENT DOCUMENTS 7,068,125 B2  6/2006  Lutz et al.
7,071,701 B2  7/2006  Roman et al.
(Continued)

OTHER PUBLICATIONS

Ward, Karl, "Understanding TC-OCXOs", Electromechanical Components, Feb. 1, 2005, http://www.electronicproducts.com/Electromechanical_Components/...ding_TC-OCXOs.aspx?terms=oven-controlled%20crystal%20oscillator.
(Continued)

*Primary Examiner* — Herbert K Roberts
*Assistant Examiner* — John M Royston
(74) *Attorney, Agent, or Firm* — Dickinson Wright PLLC

(57) ABSTRACT

Motion and/or orientation sensing systems can utilize gyroscopes, accelerometers, magnetometers, and other sensors for measuring motion or orientation of connected objects. Temperature changes affect the precision of the data output by the motion/orientation sensing device. A system is provided for controllably heating a device within a package to a desired temperature that varies based on the ambient temperature. The operating temperature of the device can then be known and controlled. The ambient temperature can be known through an ambient temperature sensor, for example. Given this information, a controller compensates the data output by the device to further improve the accuracy in the measurements. Like the amount of heating provided to the package, the amount of compensation is also based on the ambient temperature and/or the device temperature.

20 Claims, 7 Drawing Sheets

(51) Int. Cl.
*G01P 15/08* (2006.01)
*B81B 7/00* (2006.01)
*G01C 25/00* (2006.01)

(52) U.S. Cl.
CPC ............ *B81B 2201/0235* (2013.01); *B81B 2201/0242* (2013.01); *G01P 2015/0871* (2013.01)

(56) References Cited

U.S. PATENT DOCUMENTS

| | | |
|---|---|---|
| 7,253,694 B2 | 8/2007 | Hardy et al. |
| 7,378,781 B2 | 5/2008 | Vilander |
| 7,649,426 B2 | 1/2010 | Stolpman |
| 8,063,711 B2 | 11/2011 | Sutardja |
| 8,410,868 B2 | 4/2013 | Schoepf et al. |
| 2004/0141541 A1 | 7/2004 | Williams et al. |
| 2009/0007661 A1 | 1/2009 | Nasiri et al. |
| 2009/0280594 A1* | 11/2009 | Mehregany ......... G01P 15/0802 438/50 |
| 2012/0305542 A1 | 12/2012 | Donnay et al. |
| 2013/0113533 A1 | 5/2013 | Aaltonen et al. |
| 2013/0285171 A1 | 10/2013 | Najafi et al. |
| 2014/0092935 A1 | 4/2014 | Lin et al. |
| 2015/0048895 A1 | 2/2015 | Huang |
| 2017/0082648 A1 | 3/2017 | Katginari et al. |

OTHER PUBLICATIONS

Salvia, James, "Micro-Oven Based Temperature Compensation Systems for MEMS Oscillators", Dissertation, Jun. 2010, 206 pages.

* cited by examiner

SYSTEM WITH OVEN CONTROL AND COMPENSATION FOR DETECTING MOTION AND/OR ORIENTATION

CROSS-REFERENCE TO RELATED APPLICATIONS

This application is a continuation of U.S. application Ser. No. 14/925,349 filed Oct. 28, 2015, now U.S. Pat. No. 10,386,385 issued Aug. 20, 2019, the disclosure of which is hereby incorporated in its entirety by reference herein.

STATEMENT REGARDING FEDERALLY SPONSORED RESEARCH OR DEVELOPMENT

The invention was made with Government support under Contract No. IIP-1431016 awarded by the National Science Foundation, and under Contract No. N00014-13-C-0330 awarded by the Nava STTR. The Government has certain rights to the invention.

TECHNICAL FIELD

This disclosure relates to a system for controlling a heat source that heats a motion/orientation sensing device while compensating the output data from the device for increased accuracy in the data.

BACKGROUND

Microelectromechanical systems (MEMS), gyroscopes, accelerometers, inertial measurement units (IWO, magnetometers and other temperature sensitive sensors have recently improved their speed, accuracy, size, power and cost. In many applications, such as navigation, the output of these sensors is required to be extremely precise. A large contributor to the precision and accuracy of the sensors is their temperature sensitivity.

SUMMARY

According to one embodiment, a system for improving accuracy of a motion or orientation sensing device includes a package having an inner surface which defines an interior, and an outer surface which communicates with an ambient environment. A heat source is disposed inside the package. At least one internal temperature sensor is disposed inside the package and is configured to detect a temperature inside the package. A device is disposed inside the package. The device is configured to detect movement or orientation of the attached package or surrounding attached structure, at least one controller programmed to (i) receive internal temperature signals from the at least one internal temperature sensor indicating the temperature inside the package, (ii) receive signals indicating an ambient temperature of the ambient environment, (iii) control the heat source to achieve a desired temperature inside the package based on the temperature signals, (iv) receive signals from the device indicating detected movement or orientation, and (v) compensate the received signals from the device by a compensation factor that varies based on a combination of the temperature inside the package and the ambient temperature.

The compensated signals can then be used to more accurately output a motion and/or orientation signal that is given by the device.

The system may further include an ambient temperature sensor disposed outside of the interior of the package and configured to signals indicating an ambient temperature of the ambient environment.

The compensation factor may vary based on a comparison between the temperature inside the package and the ambient temperature.

The controller may further be programmed to compensate the received signal from the device according to the following relationship:

$$S_{comp} = S - (a_1 T_{amb} + a_2 T_{device} + a_3)$$

where $S_{comp}$ is compensated output, S is the detected movement or orientation before compensation, $T_{amb}$ is the temperature of the ambient environment, $T_{device}$ is the temperature inside the package, and $a_1$, $a_2$ and $a_3$ are compensation coefficients.

The signals indicating the ambient temperature of the ambient environment may be signals sent from a heat source indicating a magnitude of power consumed by the heat source in achieving the desired temperature inside the package. The at least one controller may be further programmed to estimate the ambient temperature based on the magnitude of power consumed by the heat source.

The at least one controller may be further programmed to control the heat source such that the desired temperature inside the package achieves a number of multiple set temperatures, each set temperature corresponding to a plurality of ambient temperatures.

The device may be inertial measurement unit (IMU, consisting of three accelerometers and three gyroscopes), one or multiple accelerometers, one or multiple gyroscopes, one or multiple magnetometers or other temperature sensitive devices.

The number of multiple set temperatures may increase in a stepped fashion as the ambient temperature increases.

The number of multiple set temperatures may increase continuously as the ambient temperature increases.

The at least one internal temperature sensor may include a first temperature sensor and a second temperature sensor, wherein the at least one controller is further programmed to determine a gradient of temperature of the package based on received signals from the first and second temperature sensors, and wherein the compensation factor varies based on the gradient of temperature. The desired temperature inside the package may be based on the gradient of temperature.

The at least one controller may be further programmed to retrieve the compensation factor from a calibrated lookup table based on the temperature inside the package.

The device may be an inertial measurement unit (IMU) configured to detect movement and output the detected movement to the controller.

The heat source may be a plurality of heat sources, such as a plurality of heaters, that are each disposed within the package and coupled to the at least one controller. The heat sources may be individually controlled.

According to another embodiment, a computerized method of compensating an output of a sensing, device configured to detect motion or orientation is provided. An internal-temperature signal is received from a temperature sensor, indicating an internal temperature within a package. A signal is sent to a heater to heat an interior of the package to a variable predetermined temperature. Output signals are received from a device configured to detect motion or orientation and disposed within the package indicating detected movement or orientation of the device. A signal processor compensates the output signals received from the device by compensation factors that vary based on the internal temperature. The signal processor outputs compensated output signals based on the compensation.

According to another embodiment, a system for improving accuracy in motion or orientation sensing device includes a package having an inner surface which defines an interior, and an outer surface which communicates with an ambient environment. A heat source is disposed inside the package. A device is disposed inside the package and configured to detect movement or orientation. A first temperature sensor is disposed inside the package and configured to detect a first temperature of a first location. A second temperature sensor spaced from the first temperature sensor and configured to detect a second temperature of a second location. At least one controller is coupled to the device, the heat source, and the first and second temperature sensor. The at least one controller is programmed to (i) receive the first temperature from the first temperature sensor, (ii) receive the second temperature from the second temperature sensor, (iii) based on the first and second temperatures, control the heat source to achieve a desired temperature within the package, (i) receive signals from the device indicating detected movement or orientation, (v) determine a temperature gradient across at least a portion of the device based on the first and second temperatures, and (vi) compensate the signals received from the device by a compensation factor that is based on the temperature gradient.

DETAILED DESCRIPTION

Figure 1A:
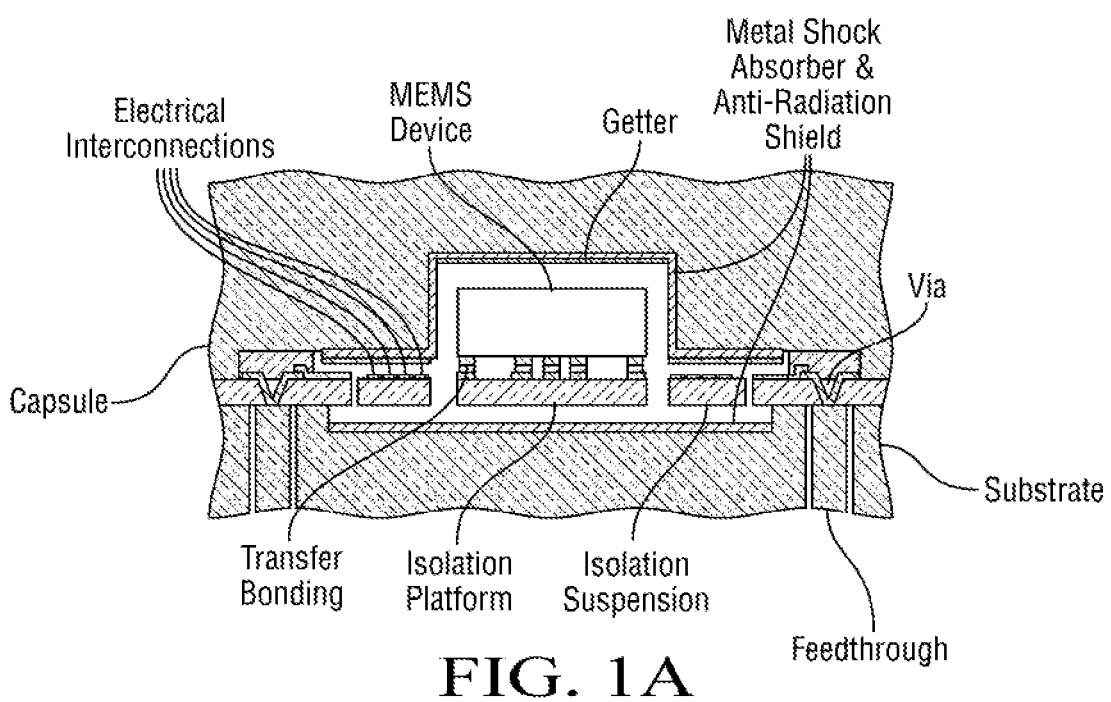
FIG. 1A is a cross-sectional schematic view of an environment-resistant micro package containing a MEMS device according to one embodiment.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

References below are made to a "controller," a "microprocessor," a "processor," a "signal processor," and a CPU. It should be understood that all of these terms can more broadly be referred to as a "controller." The controller is not a generic controller, but is specifically programmed to receive temperatures from inside and/or outside (e.g, ambient) temperature sensors and output data of a motion and/or orientation sensing device, control a heat source, and manipulate the output of the device based on temperatures.

This disclosure describes various embodiments of MEMS devices and environment-resistant module including a packaged micromachined or MEMS device associated therewith. The MEMS device may include sensing devices that are configured to sense movement, motion, and/or orientation. Such devices include inertial measurement units (IMUs, consisting of three accelerometers and three gyroscopes), one or multiple accelerometers, one or multiple gyroscopes, one or multiple magnetometers or other temperature sensitive devices. These devices can be used in a variety of settings to measure movement, motion, and/or orientation of a connected object. These devices are referred to throughout the specification as "motion or orientation sensing devices."

To assure and maintain accurate measurement by the motion or orientation sensing device, a heat source is disposed within the package surrounding the device. The heat source can be controlled by an associated controller or microprocessor. In addition to controlling the temperature inside the package, the controller can also compensate the output of the device based on a compensation factor that is set based on the temperatures of the inside and/or outside (ambient) temperatures. Thus, temperature control and output compensation combine together to improve the accuracy of the motion or orientation sensing device. In one embodiment, the heat source is a heater or oven, and in other embodiments the heat source is a circuitry with electrical resistance that generates heat as a by-product.

Figure 1B:
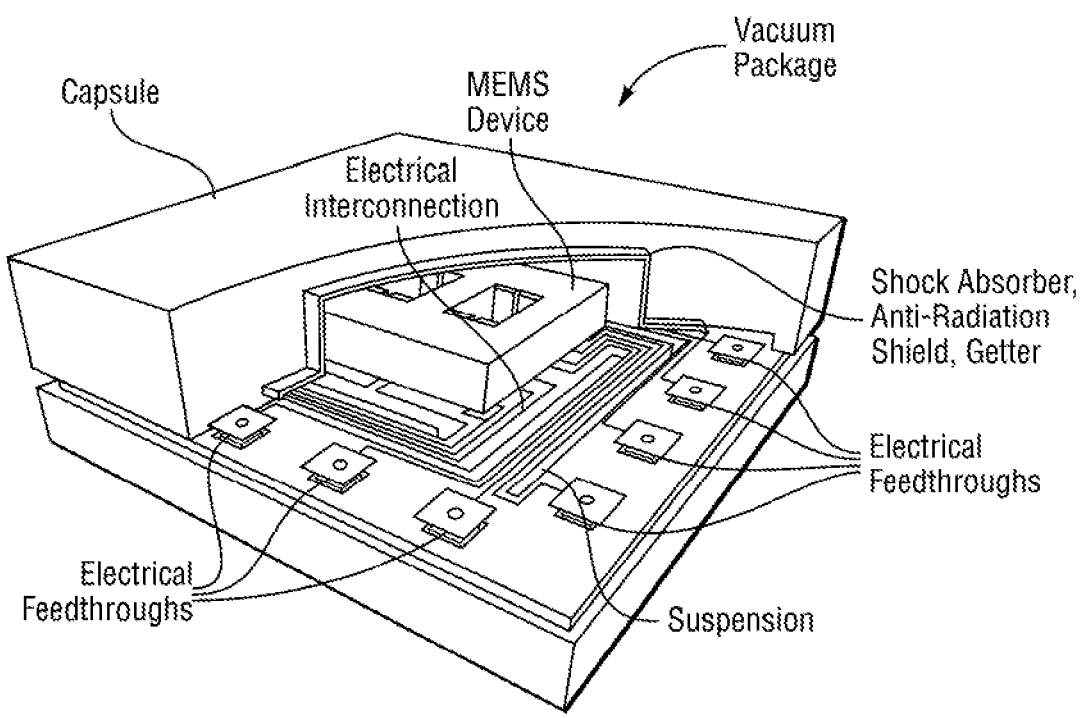
FIG. 1B is a perspective cross-sectional view of the package of FIG. 1A.

FIGS. 1A and 1B are schematic views of one embodiment of a package surrounding the MEMS device. In a preferred embodiment, the MEMS device is a motion or orientation sensing device described above for measuring motion or orientation of an associated device. The package can include: (i) a supporting substrate such as a silicon wafer or ceramic or metal substrate that may incorporate signal feedthroughs; a thin platform which provides thermal and mechanical isolation using isolation suspensions made from the glass; and (iii) a cap silicon wafer or capsule for final vacuum/hermetic encapsulation if needed. In one embodiment, the MEMS die is flipped over and attached onto a glass microplatform, which is, in turn, supported by isolation suspensions over a shallow recess formed in the supporting silicon wafer substrate. Interconnect lines are formed on the glass suspension beams and transfer electrical signals between pads on the glass microplatform and vertical feedthroughs through the bottom silicon wafer.

The attached MEMS die is oven-controlled by a heat source and temperature sensor integrated on the microplatform. As will be explained below, the heat source can be controlled and the temperature inside the package can be set to a desired temperature. Vibration isolation is provided by the suspensions made of the glass.

The isolation suspensions are stiff enough to mechanically support the platform and withstand shock/vibration, but long and flexible enough to provide thermal and vibration isolation. Both of these requirements are achieved using glass as the support and thermal isolation material. Glass has a relatively high Young's modulus and a low thermal conductivity. A thin (100 μm) glass wafer may be used to form these suspensions. The thin wafer is easy to etch and pattern using a batch-level wet etching process. Shock absorption layers, an anti-radiation shield for higher thermal isolation, and a getter layer for the high vacuum environment may also be formed inside the package.

The MEMS device is fabricated on a separate substrate, and transferred onto a microplatform that is an integral part of a second wafer or substrate. Multiple temperature sensors and/or heat sources may be used on one microplatform for additional precision and accuracy when regulating temperature or to achieve a more uniform temperature distribution across the entire unit. The MEMS device may also be another microplatform.

An oven circuit (individual die, dies or boards) may also be included with the MEMS device that control the temperature of the microplatform utilizing a temperature sensor and heat source that are either integrated on the platform, have direct contact with the platform, or are separated from the platform.

Packaging around the MEMS device is described below. However, it should be understood that, as will be described, such packaging is optional. For example, the device can be bonded to the microplatform while not in a cavity of a package; the device may be bare and not vacuum sealed, exposing the device to some surrounding environment.

If packaging is included, the transferred device may be vacuum or hermetically sealed by a cap wafer or capsule. The electrical signal leads are defined vertically on the support substrate. The vertical feedthroughs can be formed on the cap wafer or capsule, and lateral feedthroughs are also possible.

The packages shown in FIGS. 1A and 1B can provide isolation from two different sources: mechanical and thermal input. Mechanical isolation is provided through two elements: isolation suspensions that damp out the low-level and higher frequency vibration signals, and shock stops that limit the range of travel of the transferred device during high g shocks. Thermal isolation is also provided by these isolation suspensions, which are designed and fabricated to have very high thermal resistance. A control method can be executed to control the temperature using a heat source and a temperature sensor integrated on the isolation platform or on the MEMS dies. Since the devices are highly thermal-isolated, the power consumption for the constant temperature control is very low.

The microplatform can be fabricated from a thin glass wafer, or from a thick glass wafer that is mechanically thinned, or from a thick deposited glass layer, or from a thick glass/oxide layer that is deposited on a semiconductor wafer using a number of different techniques.

Figure 2:
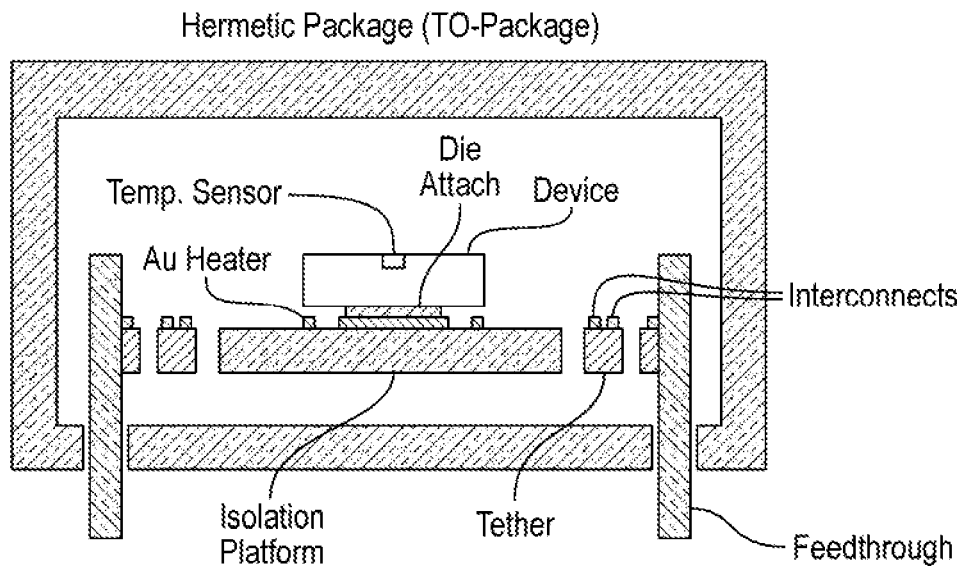
FIG. 2 is a cross-sectional schematic view of a micropackage containing motion or orientation sensing device according to one embodiment.

FIG. 2 is a more particular embodiment of the MEMS device and surrounding packaging. In FIG. 2, the MEMS device is a motion or orientation sensing device, such as one described above. The motion or orientation sensing device includes a temperature sensor coupled directly to the device or adjacent the device to measure the temperature of the device and/or its immediate surroundings. The motion or orientation sensing device is attached to the isolation platform using conductive/non-conductive epoxy, or in another embodiment, can be surface mounted to the platform with various attachment methods. The platform is supported using several tethers that have interconnect lines running over them to electrically connect the device to pins in a package, such as a TO-package.

As in FIG. 1A-1B, the isolation platform is fabricated from glass. To do so, a glass wafer is patterned and etched to form the isolation platform. The platform is complete with suspensions or tethers for mechanical support, thermal isolation and vibrational isolation.

In one embodiment, the heat source is a thin-film gold heater. Multiple heat sources may be provided. A heat source may be formed under the space between the motion or orientation sensing device and the isolation platform. Electrical signals are carried between the devices on the platform (e.g., the motion or orientation sensing device, the temperature sensor, the heat source, etc.) and the metal pins of the package using interconnect lines. These interconnect lines can be farmed and passed through tethers. A controller (not shown, but described below with reference to FIG. 3) controls the heat source(s) based on the temperature readings from the temperature sensor.

In various embodiments, one or more temperature sensors can be placed in various locations in the package: between both the motion or orientation sensing device and the platform, on the device itself, or within the package but separated from the device. The use of multiple temperature sensors within the MEMS package connected to the controller allows the controller to determine multiple temperatures of multiple known points. Having multiple temperature sensors at different locations about the motion or orientation sensing device enables the controller to determine a temperature gradient or differential across the device, which could be relatively large when the difference between the desired heat source-controlled temperature and the external environmental temperature is relatively large. For example, using multiple temperature sensors and an ambient temperature sensor, the controller can determine the temperature of the device at multiple locations and the temperature of the ambient outside the package; the controller is thus able to determine the temperature gradient across the device (or across the interior of the package) by knowing the difference in temperatures at the different locations due to the ambient temperature. In any embodiment, the controller can read inputs from various temperature sensors to determine the change in the temperature inside the package and the temperature gradient across the device. By having multiple heat sources within the package, the controller can control each heat source individually to affect the temperature gradient across the package, thereby specifically and accurately controlling different areas of the interior of the package to improve accuracy of the device.

In various embodiments, one or more temperature sensors can be placed in various locations to deduce the temperature gradient across the motion or orientation sensing device. With the temperature gradient determined, an accurate estimation of the true temperature of the device can be estimated. For example, in one embodiment, one temperature sensor is mounted underneath the motion or orientation sensing device and another temperature sensor is mounted on the device. In another embodiment, one temperature sensor is disposed within the cavity of the package, and another temperature sensor is disposed on an outer surface of the package. In yet another embodiment, one or more temperature sensors are disposed on the platform, and another temperature sensor is attached elsewhere within the package but spaced from the device. In these embodiments, the controller receives multiple temperature signals from the various temperature sensors. Based on the location of these temperature sensors, the controller is able to determine the difference in temperature at various locations throughout the package, or through the package itself. Thus, the controller can determine the temperature gradient through the package. Based on the determined temperature gradient, the controller can estimate the true temperature of the device itself if a temperature sensor is not mounted directly on the device's measurement region.

Figure 3:
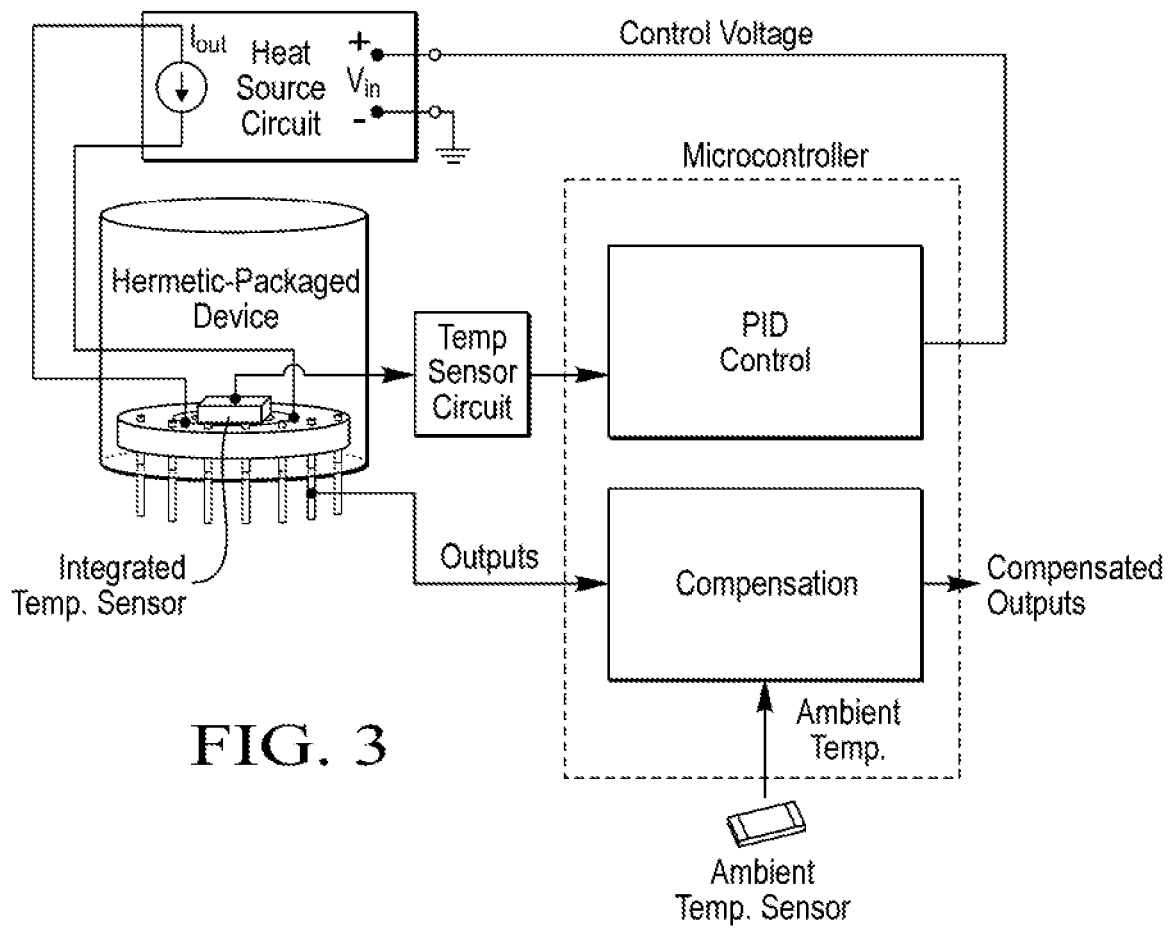
FIG. 3 is a schematic diagram of a computerized system for measuring, motion or orientation data from the motion or orientation sensing device while controlling the temperature within the packaged device and compensating the measured output, according to one embodiment.

FIG. 3 is a schematic of the oven-control system for the motion or orientation sensing device, according to one embodiment. The hermetic package of FIG. 2 is shown in FIG. 3. A heat source circuit is electrically coupled to the heat source within the package. The temperature sensors on or near the device as well as the temperature sensors on or outside the package can be electrically coupled to a temperature sensor circuit shown in FIG. 3. In case the temperature sensor is integrated inside the device, the temperature sensor circuit may not be necessary.

The heat source circuit is electrically coupled to a microcontroller for control of the heat sources within the package. The microcontroller may be a microprocessor and may include a proportional-integral-derivative controller (PID controller) being configured to run a feedback control loop. The PID controller controls the heat source. To do so, the PID controller produces an output voltage signal to the beat source circuit, and the heat source circuit converts that signal into a current that drives the heat source. In one embodiment, the heat source circuit has the following relationship between the voltage signal from the microcontroller and the current output:

$$I_{out} = g_m V_{in}$$

where $I_{out}$ is the current output from the heat source circuit to the heat sources, $g_m$ is a constant conversion gain factor, and $V_{in}$ is the control voltage input from the PID controller to the heat source circuit.

These exemplary PID controller and heat source circuit allow the heat source within the package to be controlled so that the temperature inside the package set to a desired temperature. And, as will be described below, the microcontroller also receives signals containing data relating to the temperature of the ambient temperature. This allows the microcontroller to control the heat source based on the temperature of inside the package as well as the ambient temperature, and, as will be described below, allows the microcontroller to compensate output data from the motion or orientation sensing device based on the temperature inside the package and ambient temperature.

The microcontroller is also coupled to the outputs of the motion or orientation sensing device itself, such that the microcontroller receives data indicative of the inertial motion or orientation of the packaged device and the object the package is attached to. An ambient temperature sensor is also coupled to the microcontroller to allow the controller to use the ambient temperature to compensate the output data.

Since the motion or orientation sensing device can be packaged in epoxy mold compound and due to the device being mounted on the platform, there can exist inherent temperature-induced stresses based on the difference between the temperature and the ambient temperature. These stresses can increase significantly when the difference in temperature between the device and the ambient is large. For example, an ambient temperature of −40° C. with the oven in the package attempting to maintain a temperature of 60° Cc within the package may lead to minute (but nonetheless potentially important) inaccuracies in the data output by the motion or orientation sensing device.

In a non-limiting embodiment, the system shown in FIG. 3 is a closed-loop system where both temperature compensation and oven control are utilized to reduce inaccuracies that may otherwise be present in the output of a motion or orientation sensing device due to these stresses. As described above, temperature can be measured by two or more sensors at various locations: one sensor may be on the motion or orientation sensing device, another adjacent the device on the isolation platform another spaced from the device but within the package, and another on the package itself. Other locations are contemplated. The data received by the temperature sensors is processed by the PID controller and compensation software in the microcontroller. The PID controller in the microcontroller can output a signal to the heat source circuit to output a current to the heat source within the package to attempt to maintain a desired temperature of the device. The output data of the device received by the microcontroller can then be compensated using the data from the temperature sensors and the ambient temperature from the ambient temperature sensor.

The compensation software programmed into the microcontroller can compensate the output data of the motion or orientation sensing device according to the following exemplary relationship:

$$S_{comp} = S - (a_1 T_{amb} + a_2 T_{device} + a_3)$$

where $S_{comp}$ is the data after being compensated (i.e., compensated output), S is the detected movement or orientation prior to compensation, $T_{amb}$ is the ambient temperature, $T_{device}$ is the device temperature, and $a_1$, $a_2$ and $a_3$ are compensation coefficients. While the relationship above is a first-order compensation equation, it should be understood that second-order or higher-order compensation relationships are contemplated and the above relationship is merely exemplary.

The microcontroller can thus compensate the outputs of the motion or orientation sensing device based on ambient temperature as well as the device temperature (or inside package temperature). Multiple embodiments of controls for the microprocessor are presented below that can be utilized to compensate the output of the device. The amount of compensation can be based on the temperature of the ambient and the device temperature. The combination of these temperatures can indicate a temperature distribution within the micro-package; having compensation factors calculated based on these temperatures can increase the accuracy of the output of the device especially when the difference in temperature between the device (or inside package) and the ambient is large.

As indicated by the teachings above, there is a correlation between the amount of power necessary for consumption by the heat sources, and the ambient temperature compared with the internal temperature. For example, if the ambient temperature is low (e.g., −30° C.) but the desired device temperature is relatively high (e.g., 20° C.), the PID controller will command necessary power to be sent to and consumed by the heat source circuitry. The amount of power consumed by the heat source circuitry directly corresponds with the amount of heating required to achieve or maintain the desired internal temperature within the package. Therefore, since the controller knows the internal temperature from the internal temperature sensors, and the controller knows how much power is being consumed by the heat source, the controller can infer the ambient temperature causing such magnitude of consumption of power. This method provides a system that does not require an ambient temperature sensor, but can infer the ambient temperature based on the power consumption of the heat source. Therefore, in one or more embodiments of this disclosure, the ambient temperature is inferred and there is no ambient temperature sensor coupled to the controller.

Figure 4:
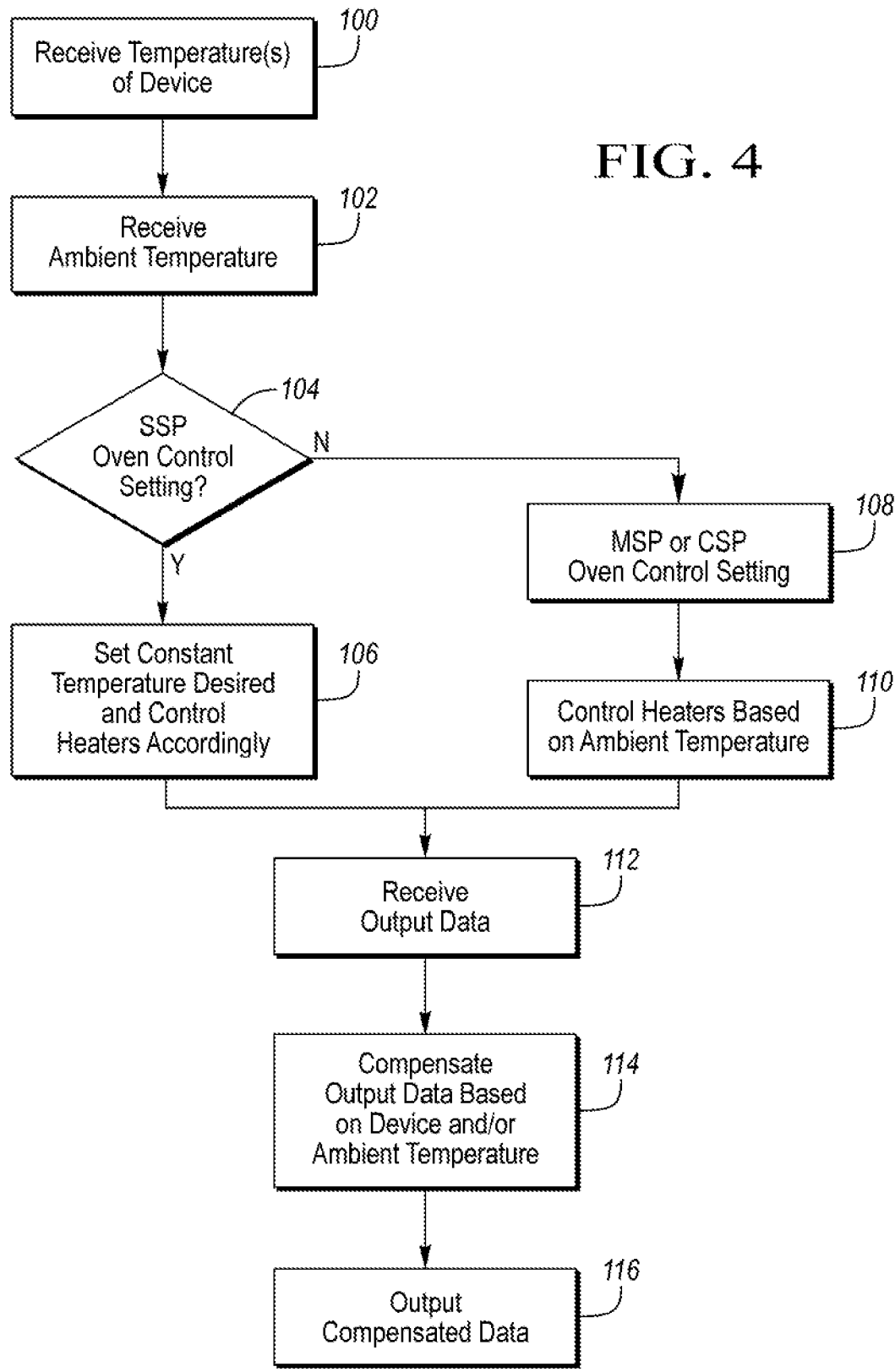
FIG. 4 is a flow chart illustrating an algorithm programmed into a processor for compensating measured output based on temperatures, according to one embodiment.

FIG. 4 illustrates an exemplary algorithm programmed into and actionable by the processor. This algorithm is one example for receiving temperature and output data from a motion or orientation sensing device, controlling the oven or heat source within the package of the device, and compensating the output data based on the temperatures. The combination of temperature control and output data compensation provides an improved, more accurate motion or orientation sensing system.

At 100, the controller receives data representing the temperature of the device and the temperature around the device within the package from the multiple temperature sensors throughout the package, as explained above. The controller also receives data representing the ambient temperature from an ambient temperature sensor.

At 104, the controller determines whether the motion or orientation sensing system is set to operate at a single set point (SSP) control setting. As will be explained below, a SSP control setting is a setting in which one single desired temperature is set and the controller controls the beat source inside the package to maintain that single desired temperature. If the SSP control setting is active, then at 106 the controller sets a constant desired temperature for the device and controls the beat source accordingly.

If, however, the system is not operating in the SSP control setting, the controller determines whether (or infers that) the system is operating in a multiple set point (MSP) or continuous set point (CSP) control setting. As will be described in more detail below, in a MSP control setting the controller is programmed to set multiple (but not infinite) "stepped" temperatures for the device based on the ambient temperature; in a CSP control setting, the controller is programmed to set a continuous desired temperature for the device that mimics the continuous nature of ambient temperatures. At 110, the controller acts accordingly by controlling the heat source to change its output to achieve the desired temperature in the device package that varies as the ambient temperature varies.

At 112, the controller proceeds to receive output data representing motion or orientation from the device itself. This output data represents the measured motion or orientation of the device as well as the object the package is attached to.

At 114, the controller compensates the measured output data based on temperature. In one embodiment, the data is compensated based on the formula explained above. In another embodiment, the data is compensated based on a look-up table of compensation factors that are set by the factory based on the calibration result.

The controller then outputs the compensated output data at 116. This compensated data can be output to a display, for example, or to other systems that use motion or orientation data as an input. These other systems are ones that require high-performance inertial sensors, such as, for example, vehicular safety systems, robots, unmanned vehicles, helicopters, satellites, survey instruments, vibration monitoring, military weaponry (such as missiles), and other systems.

FIG. 5-8 represent graphical illustrations of the output of one or more motion or orientation sensing devices prior to and after compensation.

Figure 5A:
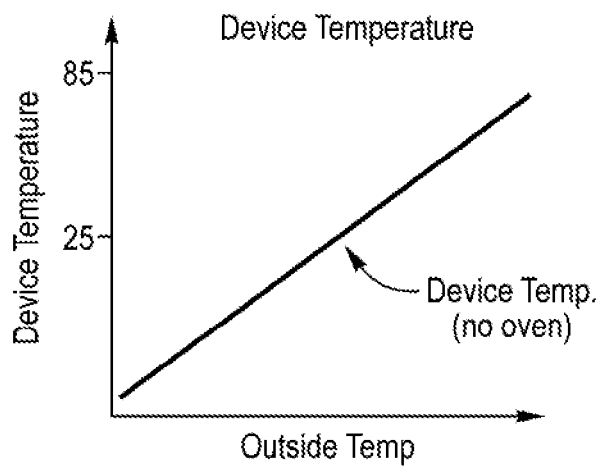
FIGS. 5A-5C are graphical illustrations of effects of temperature on a sensor, and the resulting calibrated output based on the temperature of the sensor.
Figure 5B:
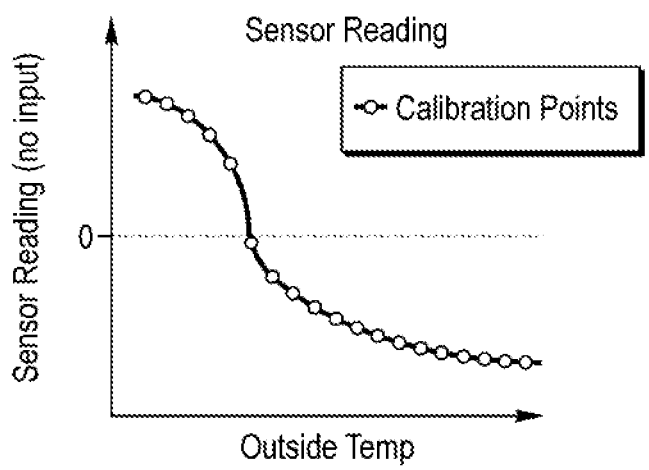
Figure 5C:
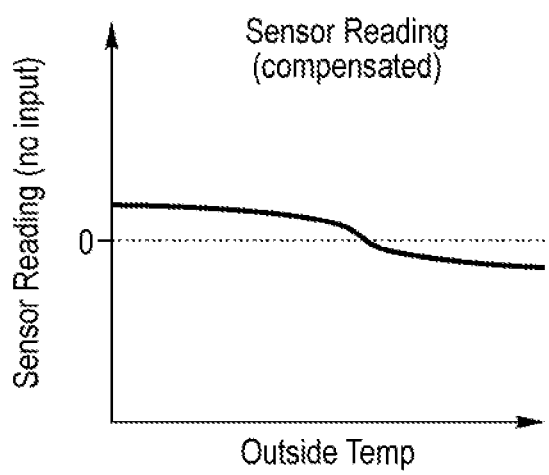

First, FIG. 5A-5C illustrates exemplary graphical illustrations of effects of temperature on a sensor, and the resulting compensated output based on the temperature of the sensor. There is no oven in the package, such as the ovens described above, or, if there is an oven, the oven is not controllable or variable to a set temperature. FIG. 5A illustrates the relationship of the temperature of the device within the package to the ambient temperature. As the ambient temperature increase, so does the device temperature due to no working heat source or oven within the package of the device.

FIG. 5B illustrates one example of creating calibration points that can be used to compensate the output from the motion or orientation sensing device based on the ambient temperature (which indicates the device temperature). In this example, as the temperature decreases, the output increases in positive value, and as the temperature increases, the output decreases and falls below zero. There is no motion/orientation input to the system, as indicated by the Y-axis. A certain number of calibration points are created during the calibration procedure. The calibration points can then be used in the compensation function explained above by the controller to compensate the output by the device. In another embodiment, the calibration points can be stored in memory (e.g., a look-up table) coupled to the processor to compensate the output data by the device. Missing points between the calibration points can be interpolated.

The result of the compensated output of the device is shown in FIG. 5C. The goal of compensating the data is to reduce the temperature-induced error of the device. Using calibration points does not reduce the error to zero for all temperatures, as there are not an infinite number of calibration points available for the compensation function or the look-up table.

FIGS. 6-8 are improvements upon the system and results exemplified in FIG. 5. In particular, the controlled temperature inside the package impacts the calibration points. Based on ambient temperature, the heat source is activated to output a certain heat, and simultaneously the data is compensated according to a compensation factor based on the temperature inside the package and/or ambient temperature. A combination of oven control and compensation functions reduces errors and improves accuracy of the data output from the device.

Figure 6A:
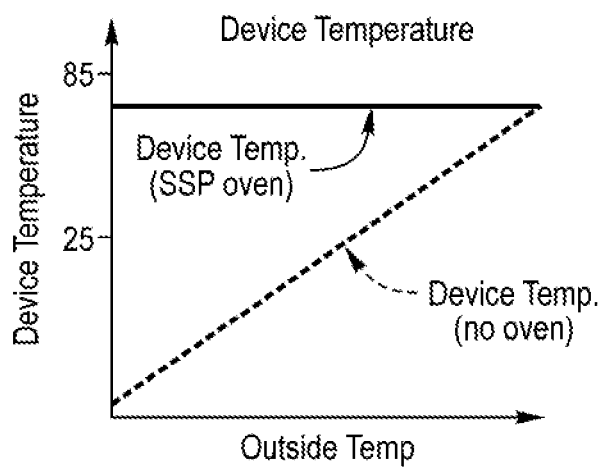
FIGS. 6A-6D are graphical illustrations of the manipulation of data retrieved from a sensor by utilizing a single set point (SSP) oven and a calibration factor.

FIG. 6A illustrates the results from a single set point (SSP) oven control implemented by the microprocessor when controlling the heat source inside the package. In a SSP oven control, the PID control maintains the temperature inside the package at a single temperature. The controller does so by constantly measuring the temperature inside the package, and controlling and varying the current output by the heat source circuit accordingly to maintain the temperature.

The plot of FIG. 5A is shown again in FIG. 6A for comparison to highlight the difference between a SSP oven control and a case in which no oven control is provided.

Figure 6B:
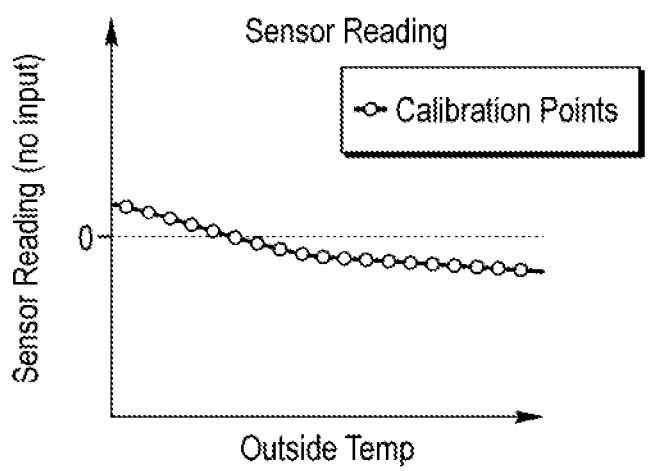

FIG. 6B shows the calibration points that are created as described above. Because the temperature within the package is maintained at a single set point, the controller can assume the difference between ambient temperature and the single set point varies correspondingly with the ambient temperature. The calibration points can be used to compensate the output data from the device based on the ambient temperature alone. In another embodiment, the actual difference between the actual temperature within the package and the ambient temperature is used to compensate the output data from the device. Missing points between the calibration points can be interpolated.

The calibration points can be used in the compensation function explained above by the controller to compensate the output by the device. Like before, in another embodiment, the calibration points can be stored in memory (e.g., a look-up table) coupled to the processor to compensate the output by the device.

Figure 6C:
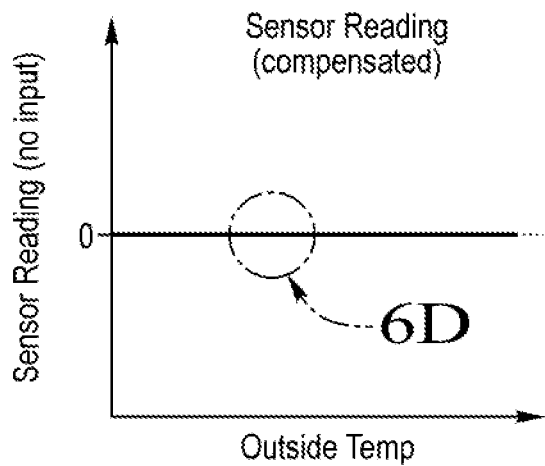
Figure 6D:
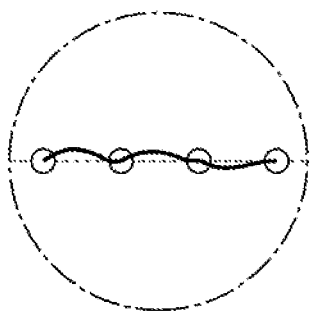

The results of using the calibration points to compensate the output from the motion or orientation sensing device is shown in FIG. 6C. Again, the compensation attempts to reduce the error in the output of the device. As shown in FIG. 6D, there remains inherent minute errors in the calibrated results, as there are not an infinite number of calibration points available for the compensation function or the look-up table. However, the error is reduced by using a combination of both the SSP oven control as well as the temperature compensation because the amount of output change is reduced due to SSP oven control.

Figure 7A:
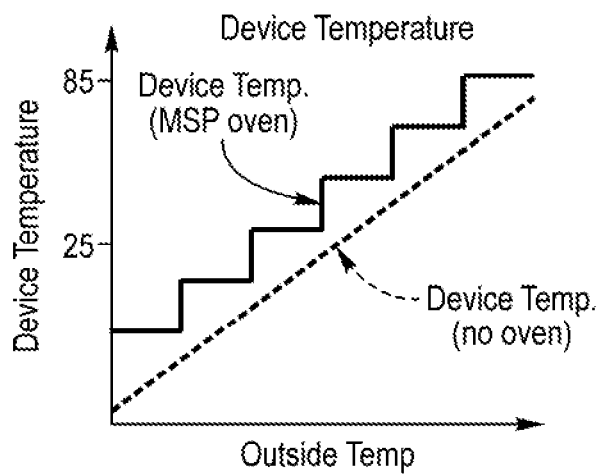
FIGS. 7A-7D are graphical illustrations of the manipulation of data retrieved from a sensor by utilizing a multiple set point (MSP) oven and corresponding calibration factors.
Figure 7B:
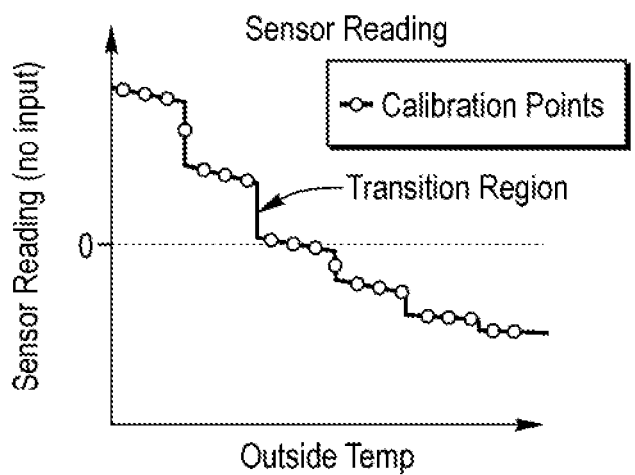
Figure 7C:
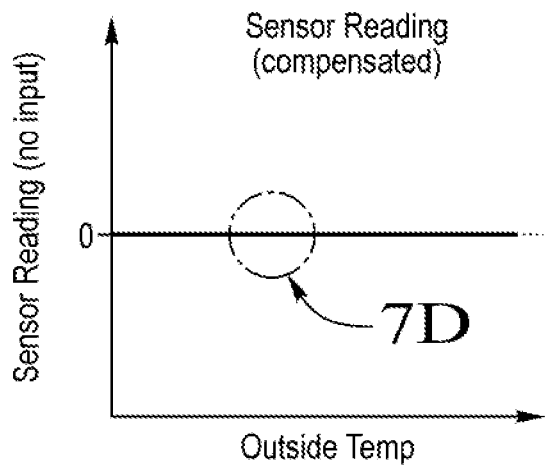
Figure 7D:
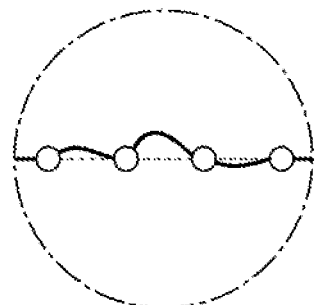

FIGS. 7A-7D are similar to FIGS. 6A-6D, except that the results of the control scheme illustrated in FIGS. 7A-7D are the results of a multiple set point (MSP) oven control rather than a SSP oven control. In a MSP oven control system, the microcontroller changes the oven set temperature as the ambient temperature changes so that the difference between the motion or orientation sensing device and the ambient remains within a certain range. This can save power in heating the device during times of cold ambient temperatures because less heat output is required because the temperature difference between the oven set point (thus the device temperature) and the ambient temperature is smaller (compared to the SSP case). As shown in FIG. 7A-7B, the device temperature can be set such that multiple ambient temperatures correspond to a single oven-controlled device temperature. This can be referred to a "stepped" increase in device temperature, as the device temperature increases in steps as the ambient temperature increases linearly. The resulting calibration points of FIG. 7B may correspondingly decrease in a slightly imbalanced "stepped" fashion with slight slope along each "step."

The results of the calibrated output from the device (shown in FIG. 7D) provide similar results as those of FIG. 6D except for the chance of reduced accuracy in transition regions between oven set points. However, an increased accuracy can be provided between the transition points, and less power can be used in heating the device, especially in colder temperatures (compared to the SSP case). Missing points between the calibration points can be interpolated.

Figure 8A:
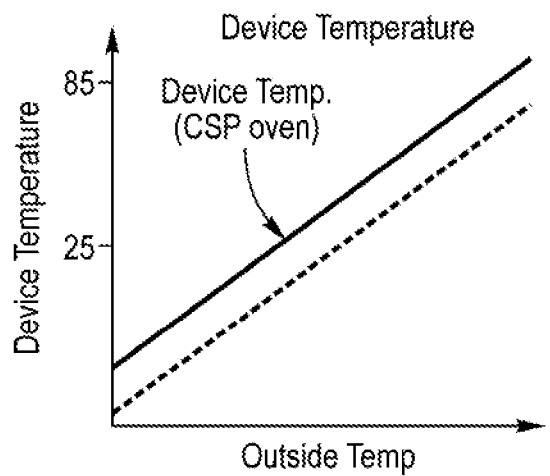
FIGS. 8A-8C are graphical illustrations of manipulation of data retrieved from a sensor by utilizing a continuous set point (CSP) oven and corresponding calibration factors.
Figure 8B:
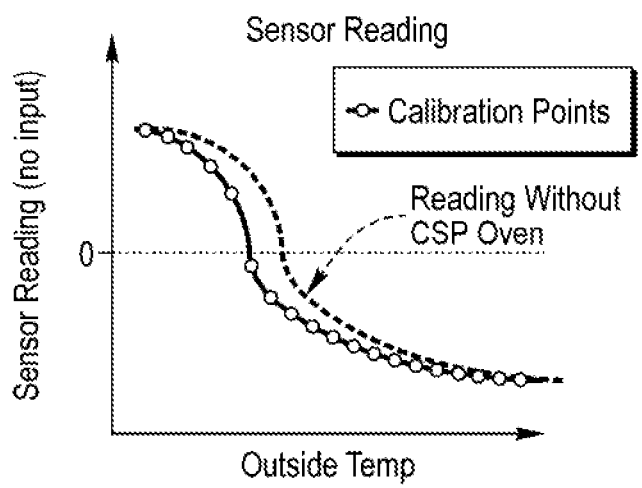
Figure 8C:
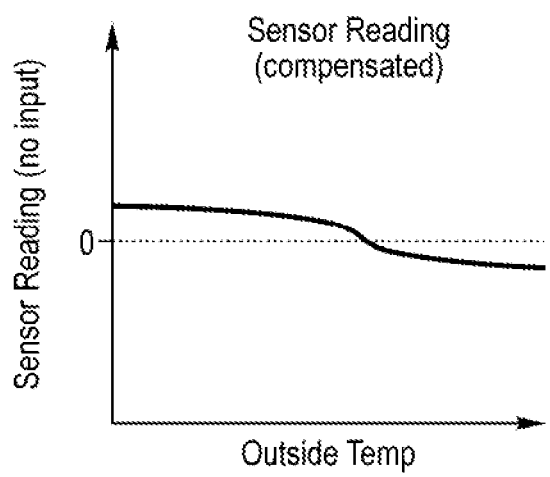

FIGS. 8A-8C are similar to FIGS. 6A-6C and 7A-7C, except that the results of the control scheme illustrated in FIGS. 8A-8C are a result of a continuous set point (CSP) oven control. In a CSP oven control, the microcontroller is programmed to alter the oven set temperature continuously as the ambient temperature changes to maintain a constant temperature difference between the device and the ambient temperature. This allows the oven to be operated with a relatively low amount of power input (compared to the SSP case).

The output from the device changes continuously as the ambient temperature changes. Similar to the case in which no oven control is provided (FIG. 5B), the output decrease sharply as CSP oven set temperature (thus the device temperature) increases, and then decreases at a reduced rate. As in the prior oven control systems, the data output from the device can be corrected and calibrated based on the calibration data. Missing points between the calibration points can be interpolated.

The combination of a continuous set point (CSP) oven and temperature compensation can result in increased performance than calibration alone because the feedback oven control can eliminate a high frequency temperature noise, for example.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

What is claimed is:

1. A system for improving accuracy in a motion or orientation sensing device, the system comprising:
   an isolation platform having a device mounting region and an isolation structure providing mechanical and electrical connections between the device and components not located on the device-mounting region;
   a heat source disposed on the isolation platform;
   a device disposed on the isolation platform; and
   at least one internal temperature sensor disposed in a local area on the isolation platform adjacent the device and configured to detect a temperature of the local area;

at least one controller programmed to:
receive internal temperature signals from the at least one internal temperature sensor indicating the temperature of the local area,
receive signals indicating an ambient temperature of an ambient environment,
control the heat source to achieve a desired temperature of the local area,
receive signals from the device, and
compensate the received signals from the device by a compensation factor that varies based on a combination of the temperature of the local area and the ambient temperature.

2. The system of claim 1, further comprising an ambient temperature sensor disposed away from the isolation platform and configured to output signals indicating an ambient temperature of the ambient environment.

3. The system of claim 2, wherein the compensation factor varies based on a comparison between the temperature of the local area and the ambient temperature.

4. The system of claim 2, wherein the controller is further programmed to compensate the received signal from the device according to the following relationship:

$$S_{comp}=S-(a_1 T_{amb}+a_2 T_{device}+a_3)$$

where $S_{comp}$ is compensated output, S is detected motion or orientation before compensation, $T_{amb}$ is the temperature of the ambient environment, $T_{device}$ is the temperature of the local area, and $a_1$, $a_2$ and $a_3$ are compensation coefficients.

5. The system of claim 1, wherein the signals indicating the ambient temperature of the ambient environment are signals from a heat source or an associated controller indicating a magnitude of power consumed by the heat source in achieving the desired temperature of the local area.

6. The system of claim 5, wherein the at least one controller is further programmed to estimate the ambient temperature based on the magnitude of power consumed by the heat source.

7. The system of claim 1, wherein the at least one controller is further programmed to control the heat source such that the desired temperature of the local area achieves a plurality of set temperatures, each set temperature corresponding to a plurality of ambient temperatures.

8. The system of claim 7, wherein the set temperatures increase in a stepped fashion as the ambient temperature increases.

9. The system of claim 7, wherein the set temperatures increase continuously as the ambient temperature increases.

10. The system of claim 1, wherein the at least one internal temperature sensor includes a first temperature sensor and a second temperature sensor, wherein the at least one controller is further programmed to determine a gradient of temperature of the local area based on received signals from the first and second temperature sensors, and wherein the compensation factor varies based on the gradient of temperature.

11. The system of claim 10, wherein the desired temperature of the local area is based on the gradient of temperature.

12. The system of claim 1, wherein the at least one controller is further programmed to retrieve the compensation factor from a calibrated lookup table based on the temperature of the local area.

13. The system of claim 1, wherein the device is a single gyroscope, multiple gyroscopes, a single accelerometer, multiple accelerometers, a single magnetometer, or multiple magnetometers or a combination thereof.

14. The system of claim 1, wherein the heat source is a plurality of heat sources, each heat source disposed within the package and coupled to the at least one controller.

15. The system of claim 1, wherein the temperature sensor is integrated into the device.

16. A computerized method of compensating an output of a device, the method comprising:
receiving a local temperature signal from a temperature sensor indicating a temperature of the local area of an isolation platform;
sending a signal to a heater to heat the local area to a variable predetermined temperature;
receiving output signals from the device disposed on the isolation platform and in the local area;
via a signal processor, compensating the output signals received from the device by compensation factors that vary based on the local temperature; and
outputting, from the signal processor, compensated output signals based on the compensating.

17. The computerized method of claim 16, further comprising receiving an external-temperature signal indicating an ambient temperature away from the isolation platform, wherein the compensation factors vary based on a combination of the temperature of the local area and the ambient temperature.

18. The method of claim 17, wherein the variable predetermined temperature increases in a stepped fashion as the ambient temperature increases linearly, such that the step of heating includes heating the local area in a stepped fashion as the ambient temperature increases linearly.

19. The method of claim 17, wherein the variable predetermined temperature increases continuously as the ambient temperature increases linearly, such that the step of heating includes heating the local area in a continuously-increasing fashion as the ambient temperature increases linearly.

20. The method of claim 16, wherein the heat source is a plurality of heat sources, each heat source is disposed on the isolation platform and coupled to the signal processor.

* * * * *